(12) United States Patent
Ang

(10) Patent No.: US 8,110,502 B2
(45) Date of Patent: Feb. 7, 2012

(54) METHOD OF IMPROVING ADHESION STRENGTH OF LOW DIELECTRIC CONSTANT LAYERS

(75) Inventor: Ting Cheong Ang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 421 days.

(21) Appl. No.: 11/394,529

(22) Filed: Mar. 30, 2006

(65) Prior Publication Data

US 2007/0134900 A1 Jun. 14, 2007

(30) Foreign Application Priority Data

Dec. 12, 2005 (CN) .......................... 2005 1 0111389

(51) Int. Cl.
*H01L 21/4763* (2006.01)
*H01L 21/44* (2006.01)
(52) U.S. Cl. ........ 438/677; 438/658; 438/654; 438/644; 438/628; 257/E21.241
(58) Field of Classification Search .................. 438/667, 438/658, 654, 644, 628
See application file for complete search history.

(56) References Cited

U.S. PATENT DOCUMENTS

| 6,028,015 | A * | 2/2000 | Wang et al. | 438/789 |
| 6,174,793 | B1 * | 1/2001 | Tsai et al. | 438/586 |
| 6,271,136 | B1 * | 8/2001 | Shue et al. | 438/687 |
| 6,492,266 | B1 * | 12/2002 | Ngo et al. | 438/687 |
| 6,660,634 | B1 * | 12/2003 | Ngo et al. | 438/687 |
| 7,101,788 | B2 * | 9/2006 | Smith et al. | 438/637 |
| 2006/0178017 | A1 * | 8/2006 | Owada et al. | 438/778 |

FOREIGN PATENT DOCUMENTS

WO 2005/091348 A1 9/2005

OTHER PUBLICATIONS http://www.meridianeng.com/inertgas.html, Dec. 1996.*

* cited by examiner

*Primary Examiner* — David Zarneke
(74) *Attorney, Agent, or Firm* — Kilpatrick Townsend & Stockton LLP

(57) ABSTRACT

A method for manufacturing a semiconductor device is provided. In a specific embodiment, the method includes providing a semiconductor substrate with a surface region. The surface region includes one or more layers overlying the semiconductor substrate. Additionally, the method includes forming a dielectric layer overlying the surface region and forming a diffusion barrier layer overlying the dielectric layer. Moreover, the method includes subjecting the diffusion barrier layer to a plasma environment to facilitate adhesion between the diffusion barrier layer and the dielectric layer at an interface region. Also, the method includes processing the semiconductor substrate while maintaining attachment between the dielectric layer and the diffusion barrier layer at the interface region. The subjecting the diffusion barrier layer to a plasma environment includes maintaining a thickness of the barrier diffusion layer.

17 Claims, 12 Drawing Sheets

With Treatment
Film Roughness = 46 nm

No Treatment
Film Roughness = 17 nm

METHOD OF IMPROVING ADHESION STRENGTH OF LOW DIELECTRIC CONSTANT LAYERS

CROSS-REFERENCES TO RELATED APPLICATIONS

This application claims priority to Chinese Patent Application No. 200510111389.8 (Ref. No. I-03-249), filed Dec. 12, 2005, entitled "Method of Improving Adhesion Strength of Low Dielectric Constant Layers," by Inventor Ting Cheong Ang, commonly assigned, incorporated by reference herein for all purposes.

BACKGROUND OF THE INVENTION

The present invention is directed to integrated circuits and their processing for the manufacture of semiconductor devices. More particularly, the invention provides a method for improving the adhesion strength of low dielectric strength dielectric layers used in the fabrication of semiconductor devices. But it would be recognized that the invention has a much broader range of applicability. Certain embodiments of the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. However, one significant problem that occurs with shrinking figure sizes on an IC is that the conducting portions of an IC such as wire interconnects and transistors often need to be placed closer and closer together, and the insulating dielectrics used to separate the conducting portions also become thinner to accommodate for the reduced size between conducting portions. However, as the transistors are placed in greater proximity to each other, problems in cross-talk noise, power dissipation, RC delay and others can occur.

One design implementation choice that can help alleviate the problems described above as a result of more tightly packed IC layouts is the use of low-k dielectrics between the conducting portions of the IC. For example, low-k dielectrics have a k-value or dielectric constant of below 3.0. Their use can result in lower parasitic capacitance and enable faster switching speeds and lower heat dissipation within the IC. However, the incorporation of low-k dielectric materials into IC chips can result in integration difficulties not previously foreseen.

From the above, it can be seen that an improved technique for processing semiconductor devices is desired.

BRIEF SUMMARY OF THE INVENTION

The present invention is directed to integrated circuits and their processing for the manufacture of semiconductor devices. More particularly, the invention provides a method for improving the adhesion strength of low dielectric strength dielectric layers used in the fabrication of semiconductor devices. But it would be recognized that the invention has a much broader range of applicability. Certain embodiments of the invention can be applied to microprocessor devices, memory devices, application specific integrated circuit devices, as well as various other interconnect structures.

In a specific embodiment, a method for manufacturing a semiconductor device is provided. The method includes providing a semiconductor substrate with a surface region. The surface region includes one or more layers overlying the semiconductor substrate. Additionally, the method includes forming a dielectric layer overlying the surface region and forming a diffusion barrier layer overlying the dielectric layer. Moreover, the method includes subjecting the diffusion barrier layer to a plasma environment to facilitate adhesion between the diffusion barrier layer and the dielectric layer at an interface region. Also, the method includes processing the semiconductor substrate while maintaining attachment between the dielectric layer and the diffusion barrier layer at the interface region. The subjecting the diffusion barrier layer to a plasma environment includes maintaining a thickness of the barrier diffusion layer.

In another specific embodiment, a method of manufacturing a semiconductor device is provided. The method includes providing a semiconductor substrate with a surface region. The surface region includes one or more layers overlying the semiconductor substrate. Additionally, the method includes forming a diffusion barrier layer overlying the surface region. Moreover, the method includes subjecting the diffusion barrier layer to a plasma environment. The method further includes maintaining a thickness of the barrier diffusion layer during the subjecting the diffusion barrier layer to a plasma environment. Also, the method includes forming a dielectric layer overlying the diffusion barrier layer. Additionally, the method includes processing the semiconductor substrate while maintaining attachment between the low k dielectric layer and the diffusion barrier layer at the interface region. The subjecting the diffusion barrier layer to a plasma environment is performed to facilitate adhesion between the diffusion barrier layer and the dielectric layer at an interface region.

In yet another specific embodiment, a method for manufacturing a semiconductor device is provided. The method includes providing a semiconductor substrate with a surface region. The surface region includes one or more layers overlying the semiconductor substrate. Additionally, the method includes forming a dielectric layer overlying the surface region and forming a diffusion barrier layer overlying the dielectric layer. Moreover, the method includes subjecting the diffusion barrier layer to a plasma environment for a duration ranging from 2 seconds to 20 seconds at a pressure ranging from 1 Torr to 10 Torr with an RF power ranging from 10 W to 200 W. In addition, the method includes processing the semiconductor substrate while maintaining attachment between the dielectric layer and the diffusion barrier layer at the interface region. The subjecting the diffusion barrier layer to a plasma environment includes maintaining a thickness of the barrier diffusion layer.

In yet another specific embodiment, a method of manufacturing a semiconductor device is provided. The method includes providing a semiconductor substrate with a surface region. The surface region includes one or more layers overlying the semiconductor substrate. In addition, the method includes forming a diffusion barrier layer overlying the surface region. Moreover, the method includes subjecting the diffusion barrier layer to a plasma environment for a duration ranging from 2 to 20 seconds at a pressure ranging from 1 Torr to 10 Torr with an RF power ranging from 10 W to 200 W. Also, the method includes maintaining a thickness of the barrier diffusion layer during the subjecting the diffusion barrier layer to the plasma environment. Additionally, the method includes forming a dielectric layer overlying the diffusion barrier layer. Furthermore, the method includes processing the semiconductor substrate while maintaining attachment between the low k dielectric layer and the diffusion barrier layer at the interface region. Subjecting the diffusion barrier layer to a plasma environment is performed to facilitate adhesion between the diffusion barrier layer and the dielectric layer at an interface region.

Many benefits are achieved by way of the present invention over conventional techniques. For example, the present technique provides an easy to use process that relies upon conventional technology. In some embodiments, the method provides a method of increasing the adhesion strength between a dielectric layer and adjoining layers to prevent delamination or voiding caused by subsequent processes such as a CMP process. Additionally, the method provides a process that is compatible with conventional processing technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
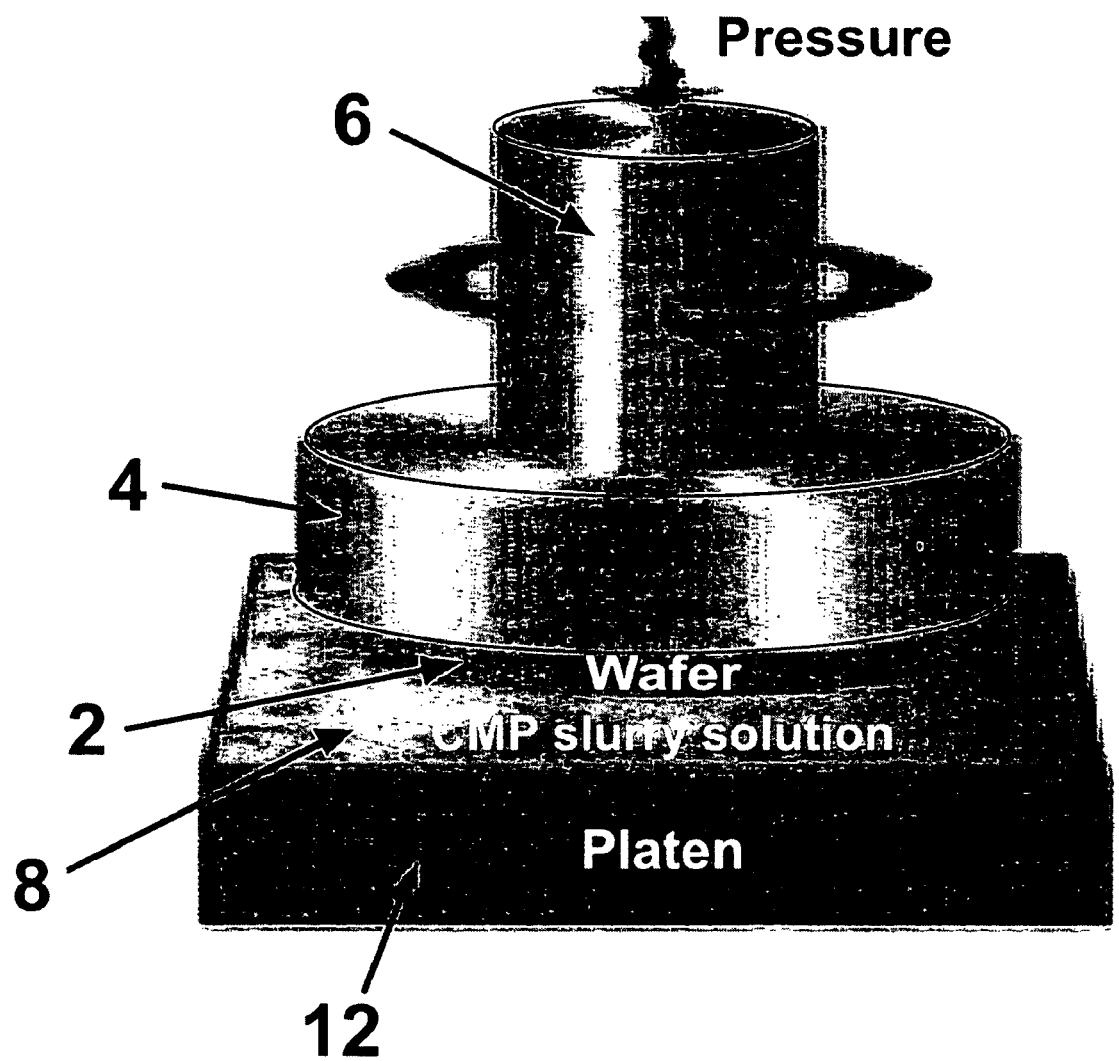
FIG. 1 is a simplified conventional diagram illustrating the operation of a chemical-mechanical polishing (CMP) device used to planarize layers formed on a substrate.

The present invention is directed to integrated circuits and their processing for the manufacture of semiconductor devices. More particularly, the invention provides a method for improving the adhesion strength of low dielectric strength dielectric layers used in the fabrication of semiconductor devices. But it would be recognized that the invention has a much broader range of applicability. Certain embodiments of the invention can be applied to microprocessor devices, memory devices, application specific integrated circuit devices, as well as various other interconnect structures.

When low-k layers are used as dielectric insulators within semiconductor devices, they can provide a lower k-value, or a lower dielectric constant than certain conventional insulation materials. This can lead to reduced amounts of parasitic capacitance and an increased switching speed of the device being formed. However, low-k materials also tend to be porous and less dense in comparison to high-k dielectrics, which can lead to a reduced mechanical strength. A tradeoff between the electrical and physical properties of the low-k material often must be made for successful inclusion into the layers within an integrated circuit. One result of this is that low-k layers are significantly 'softer' than conventional intermetal dielectric layers. General 'softness' of the layers can be determined by measuring the hardness and modulus, both physical characteristics of the deposited layer. For example, hardness is a measure of the material expressing its resistance to physical deformation, while the modulus of a material, or Young's Modulus, is a measure of the stiffness of a material that is equal to the ratio of stress to strain before the material yields to ductile deformation. One difference between the two is that hardness can measure permanent physical deformation, while the modulus can measure the stiffness and elastic deformation of the layer. Combined together, they provide a measure of the mechanical strength of deposited low-k layers.

Table 1 shows modulus and hardness values for a variety of low-k layers, including Aurora 2.85, Black Diamond, Coral, and SiLK. Fluorosilicate glass (FSG) is included as a representative high-k layer to additionally illustrate the differences in physical characteristics between low-k layers and high-k layers.

TABLE 1

Modulus and Hardness Values for Low-k films

| | Film | | | | |
|---|---|---|---|---|---|
| | Aurora 2.85 | Black Diamond | Coral | SiLK | FSG |
| Modulus (GPa) | 12 | 9 | 8.6 | 2.7 | 90 |
| Hardness (GPa) | 2 | 1.5 | 1.45 | 0.16 | 12 |

The dielectric layers exhibited a modulus of between 2.7 and 12 GPa, while the FSG layer exhibited a modulus of 90 GPa. The hardness values for the low-k layers were between 0.16 and 2 GPa while the hardness of the FSG layer was 12 GPa. It can be seen from the relative hardness and modulus values that low-k layers exhibit a significantly reduced mechanical strength when compared against high-k layers.

One consequence of the reduced mechanical strength of low-k layers is that it leads to lower cohesive strength and weak adhesion properties for the low-k layer. This makes it more difficult to integrate low-k layers into semiconductor structures, especially when multiple interconnect layers are needed to obtain optimum device performance. Weak adhesion properties can lead to delamination problems with adjacent layers when stresses are exerted on the wafer. For example, through wafer sawing or scribing, chip-to-package assembly, thermal stress, chemical-mechanical polishing (CMP), and other processes can all exert stress on and cause delamination of the wafer. Delamination is a disconnect or crack between two layers in a silicon stack, which can result in voiding between the layers. While these cracks pose significant problems during their initial formation, they can create even greater problems later during the preparation of a wafer when the interface adjoining the crack is pulled apart by process or packaging induced forces.

One such example of a process which can exert forces upon a wafer that can lead to delamination is a chemical-mechanical polishing (CMP) process used to planarize the top surface of a partly-processed wafer or substrate. FIG. 1 is a simplified conventional diagram illustrating the operation of a chemical-mechanical polishing (CMP) device used to planarize layers formed on a substrate. The CMP process uses an abrasive polishing pad (not shown, covered by slurry 8) mounted on a rotating platen 12 several times larger than the wafer 2. An abrasive, corrosive liquid slurry 8 is distributed over the polishing pad to physically grind or planarize the microscopic topographic features on a partially processed wafer 2 so that subsequent processes can begin from a flat surface. The back surface of wafer 2 is mounted to a polishing head 4 and held in place by a retaining ring (not shown) so the front surface of the wafer is exposed to abrasive slurry 8. Polishing head 4 is rotated at different rates in a circular range of motion to even out any irregular topography which may exist on wafer 2. Additionally, a downwards pressure is exerted through shaft 6 which presses wafer 2 down against the abrasive slurry 8 located on the polishing pad. Abrasive slurry 8 also chemically reacts and weakens the material being removed, thus accelerating the rate of removal. The polishing pad further serves to wipe away the removed material, preventing it from being lodged on the surface of the wafer 2.

Figure 2:
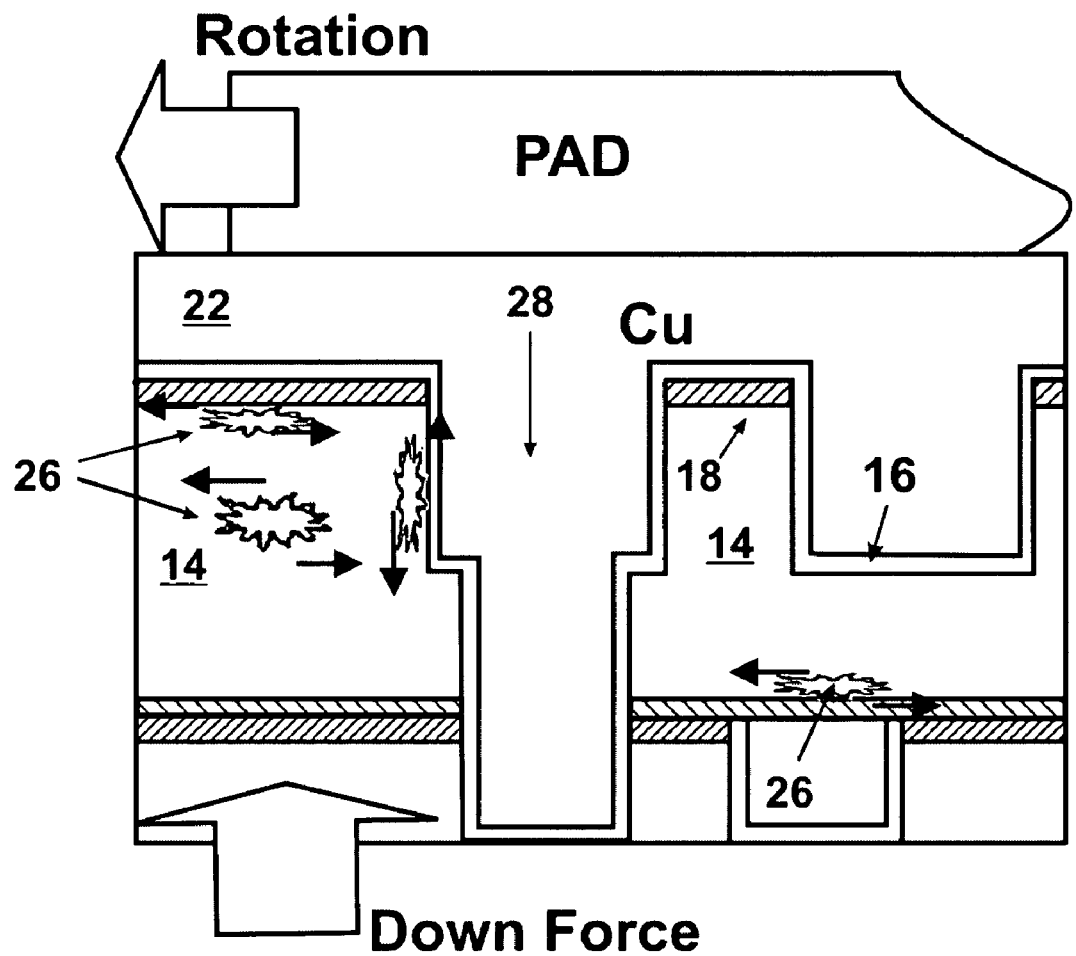
FIG. 2 is a simplified exemplary diagram of an substrate interconnect layout and potential delamination problems.

The combination of downwards force and rotational movement by polishing head 4 attached to wafer 2 aids in the removal of excess material on the surface of wafer 2. However, these forces can also lead to delamination between adjacent layers on a silicon stack formed on wafer 2, as shown in FIG. 2. FIG. 2 is a simplified exemplary diagram of an substrate interconnect layout and potential delamination problems. This diagram is merely an example, which should not unduly limit the scope of the claims herein. One of ordinary skill in the art would recognize many variations, modifications, and alternatives.

Low-k layer 14 is deposited and etched to form a trench 28 within the low-k layer 14. A dual-damascene or single damascene process may be used to create trench 28 shown within FIG. 2. Diffusion barrier layer 16 covers the top and side surfaces of low-k layer 14 extending into trench 28. For example, diffusion barrier layer 16 may comprise silicon carbide, silicon nitride, titanium nitride, tungsten-carbon-nitride, aluminum nitride, tantalum nitride, or other suitable barrier materials. Diffusion barrier layer 16 is used to prevent the diffusion of copper ions in copper layer 22 from diffusing into low-k layer 14 and affecting its electrical properties. A cap layer 18 may be present at the interface between the diffusion barrier layer 16/copper layer 22 and the low-k layer 14 because copper can often corrode or degrade adjacent materials and can adhere poorly to low-k layer 14 below.

However, when a downwards force and rotational movement is applied to a partly-processed wafer, delamination can occur at delamination regions 26 because of poor adhesion strength between the low-k layer 14 and diffusion barrier layer 16. The down force as shown in FIG. 2 is shown as being oriented in an upwards direction, as the backside of the wafer is attached to the polishing head and the topmost layer on the wafer is in contact with the abrasive slurry and planarized to a desired thickness. Delamination in can occur in both a horizontal direction between cap layer 18 or diffusion barrier layer 16 and low-k layer 14, or between the diffusion barrier layer 16 and low-k layer 14 in a vertical direction. As multiple copper interconnect layers may be present within a silicon stack, delamination between the low-k layers and diffusion barrier layers is greatly exacerbated when multiple CMP processes are employed within the processing of the wafer. However, it is noted that processes other than a CMP process could also cause delamination between different layers within the silicon stack. Of course, there can be other variations, modifications, and alternatives.

Figure 3:
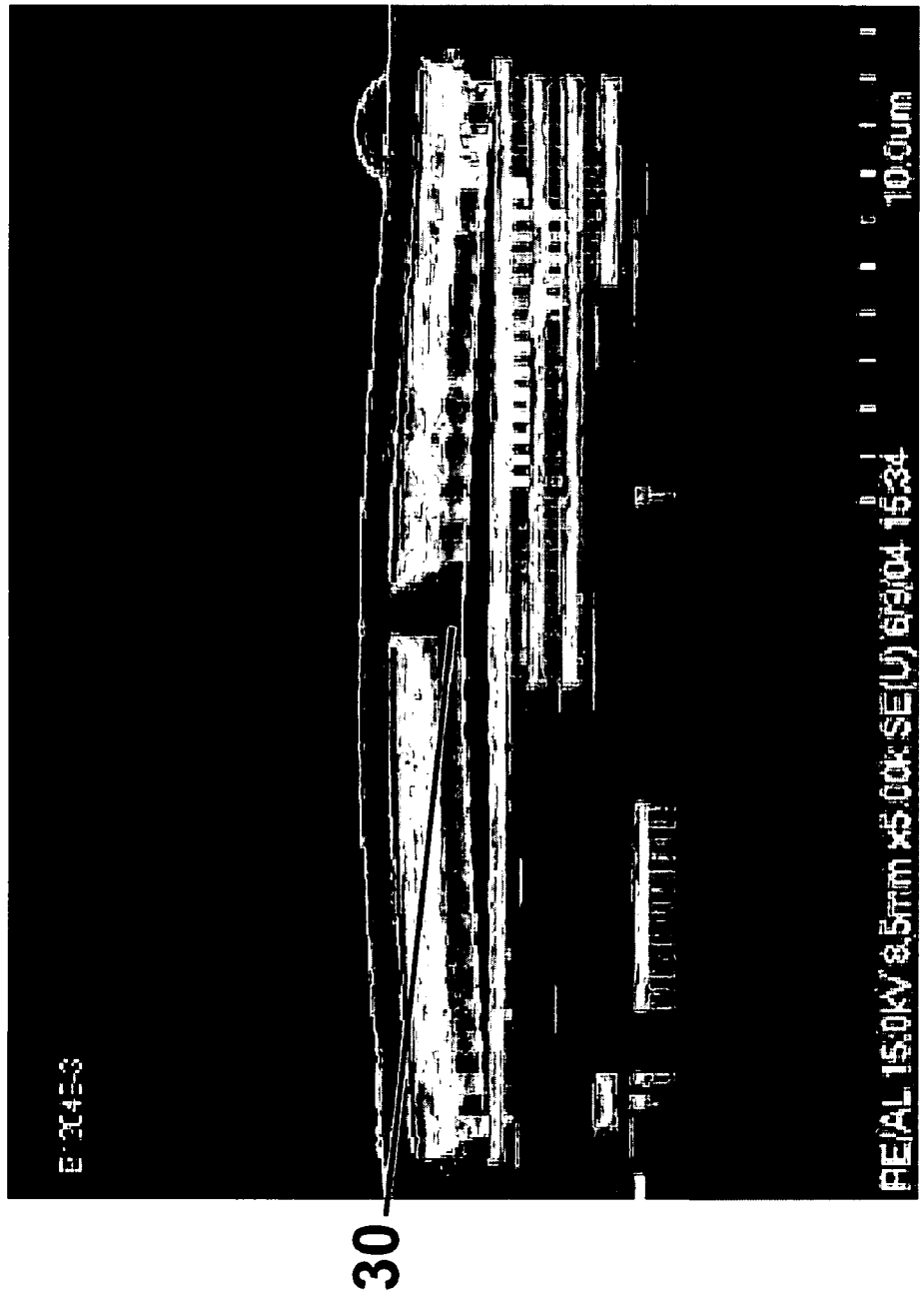
FIG. 3 is a scanning electron microscope (SEM) image of a cross-section of a semiconductor substrate showing delamination.

FIG. 3 is a scanning electron microscope (SEM) image of a cross-section of a semiconductor substrate showing delamination. This image is merely an example, which should not unduly limit the scope of the claims herein. One of ordinary skill in the art would recognize many variations, modifications, and alternatives.

Delaminated area 30 can be clearly seen as a void that occurs in between layers within the silicon stack. In this specific instance, the delamination has occurred in a horizontal interface between the two layers as a result of the downwards and rotational forces exerted by a CMP process. Voiding can cause severe performance issues by increasing leakage currents, impairing device performance, and decreasing electrical reliability of the circuits being formed.

One measure of the strength of adhesion between layers is the adhesion energy, or the force required to create a separation between the two surfaces. A way to measure the adhesion energy between two layers is to use a four-point bend test, in which carefully applied flexural strains are applied using a controlled force to measure the amount of strain occurring between the two layers. A sudden rise in resistance quickly followed by a break in electrical continuity often marks the point of failure where the two layers are separated by delamination or voiding. Improvements in the adhesion strength between barrier layers and low-k layers could be made to prevent delamination of the layers.

An exemplary method of improving the adhesion strength of low dielectric constant layers to underlying dielectric or copper layers involves a plasma treatment of the interface between the two layers. The plasma treatment can occur either before or after deposition of the low-k dielectric layer has been deposited, depending on the interface where the adhesion strength is to be increased. For example, the treatment process occurs prior to the CMP process or other process that could cause delamination between the dielectric and adjoining layers. The treatment can be performed in any sort of processing environment which can provide a plasma formed near the wafer. Of course, there can be other variations, modifications, and alternatives.

Table 2 shows the results from testing the amount of adhesion energy for three sample wafers between a silicon carbide (SiC) barrier layer and a low-k dielectric layer before and after plasma treatment of the wafer according to an embodiment of the present invention. The adhesion energy is measured in $J/m^2$, or the force required to separate the two layers.

TABLE 2

| | Adhesion Energy (J/m²) | | |
|---|---|---|---|
| | Sample 1 | Sample 2 | Sample 3 |
| Without Treatment | 2.2 | 2.24 | 2.1 |
| With Treatment | 6.16 | 6.2 | 6.21 |

A nearly three-fold increase in adhesion energy can be achieved by using a plasma treatment process. This improves the resistance against delamination within the silicon stack as more energy is required to separate the dielectric layer and diffusion barrier layer.

Figure 4B:
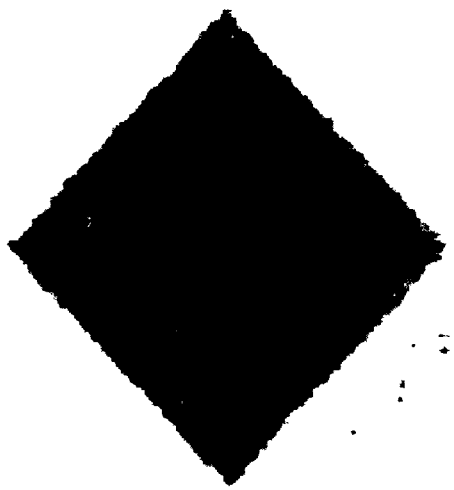
FIG. 4B is an image taken by an atomic force microscope of a layer that has been treated to increase the roughness of the deposited layer according to an embodiment of the present invention.
Figure 4A:
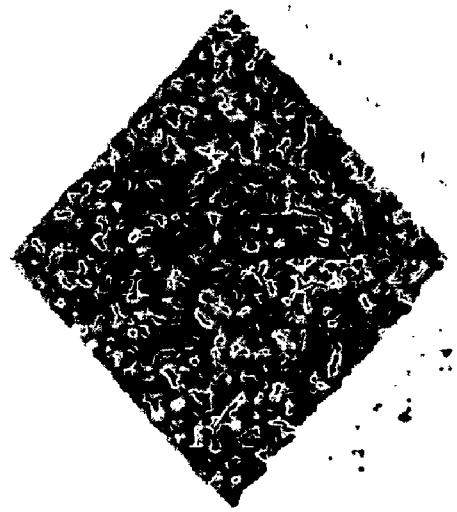
FIG. 4A is an image taken by an atomic force microscope of a layer deposited over a substrate which has not been treated to increase the roughness of the deposited layer.

Without being limited by an explanation, one potential reason as to why plasma treatment of the diffusion barrier layer improves the adhesion strength between a low-k dielectric layer and a diffusion barrier layer is that the roughness of the diffusion barrier layer is increased, thus resulting in a greater amount of surface area for the two layers to contact each other. FIG. 4A is an image taken by an atomic force microscope of a layer deposited over a substrate which has not been treated to increase the roughness of the deposited layer, while FIG. 4B is an image of a layer that has been treated to increase the roughness of the deposited layer according to an embodiment of the present invention. These diagrams are merely examples, which should not unduly limit the scope of the claims herein. One of ordinary skill in the art would recognize many variations, modifications, and alternatives.

By comparing FIG. 4A to FIG. 4B, it can be seen that the surface roughness of the layer shown in FIG. 4B is greater than that of the layer shown in FIG. 4A. Due to the increased amount of surface area between the diffusion barrier layer and the low-k dielectric layer, the adhesion energy between the two layers is greater, making delamination of the layers by subsequent processes more difficult. The root-mean-square roughness of the layer in FIG. 4A was 17 nm and post-treatment, the layer roughness was 46 nm, which shows that the roughness of the treated layer increases after treatment. Of course, there can be other variations, modifications, and alternatives.

Figure 5:
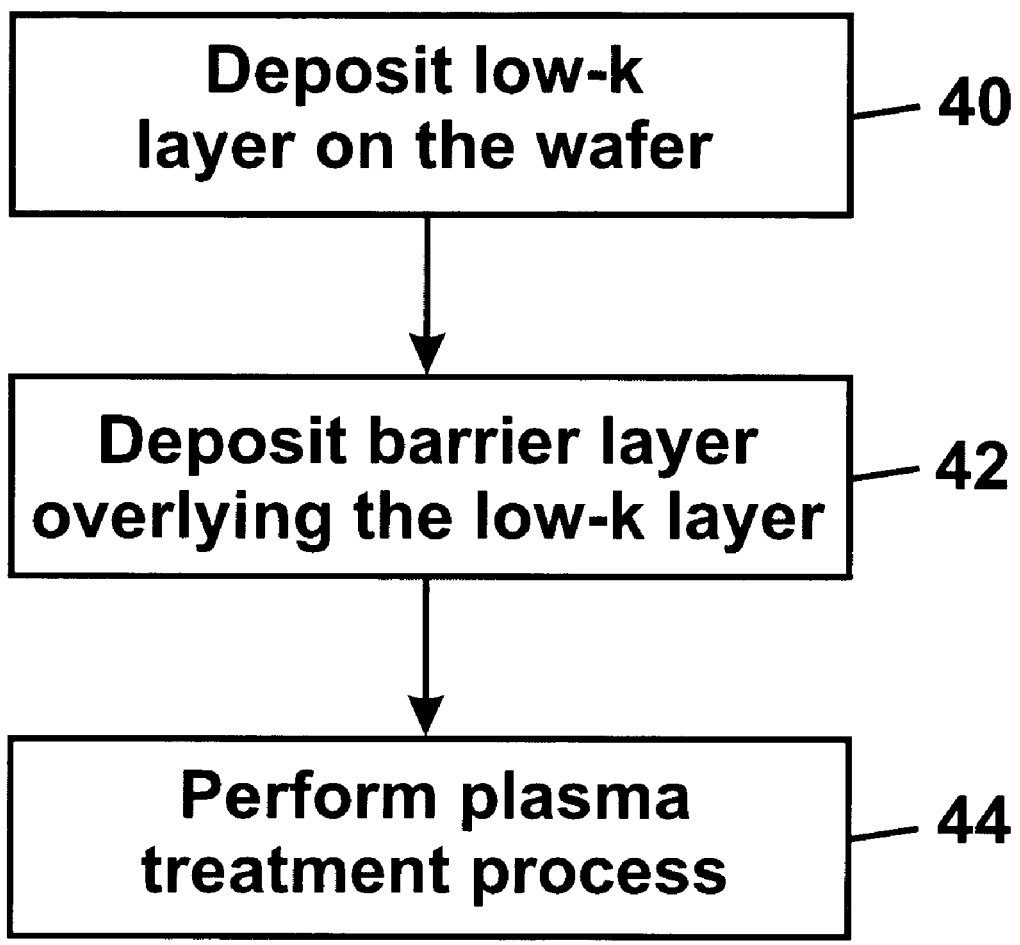
FIGS. 5 and 7 are simplified exemplary process flows showing the deposition of low-k and diffusion barrier layers and a plasma treatment process according to embodiments of the present invention.
Figure 6A:
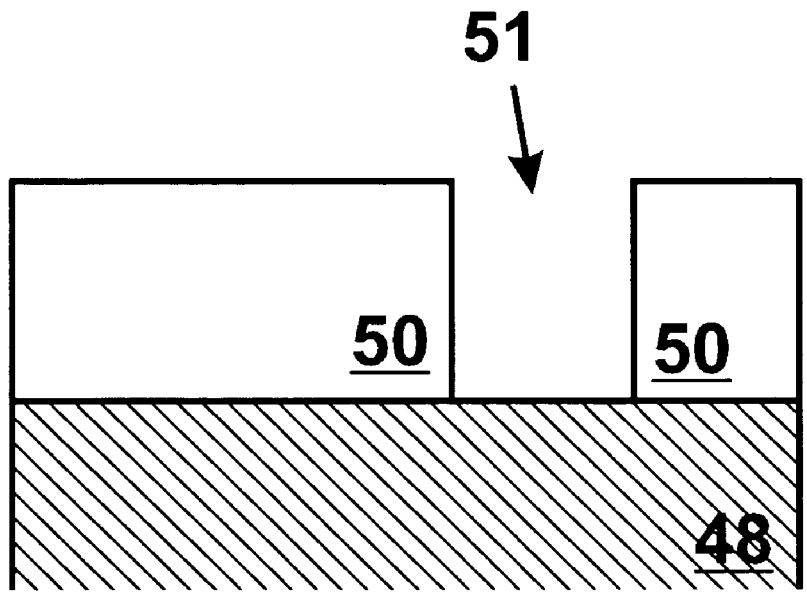
FIGS. 6A-6C and 8A-8C are exemplary simplified cross-sectional views of a semiconductor substrate showing the deposition of low-k and diffusion barrier layers and a plasma treatment process according to embodiments of the invention.
Figure 6B:
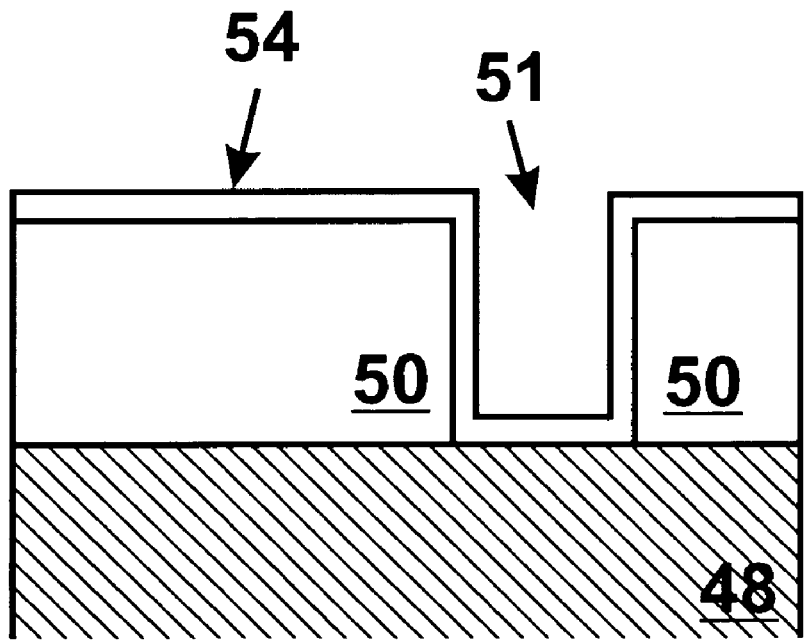
Figure 6C:
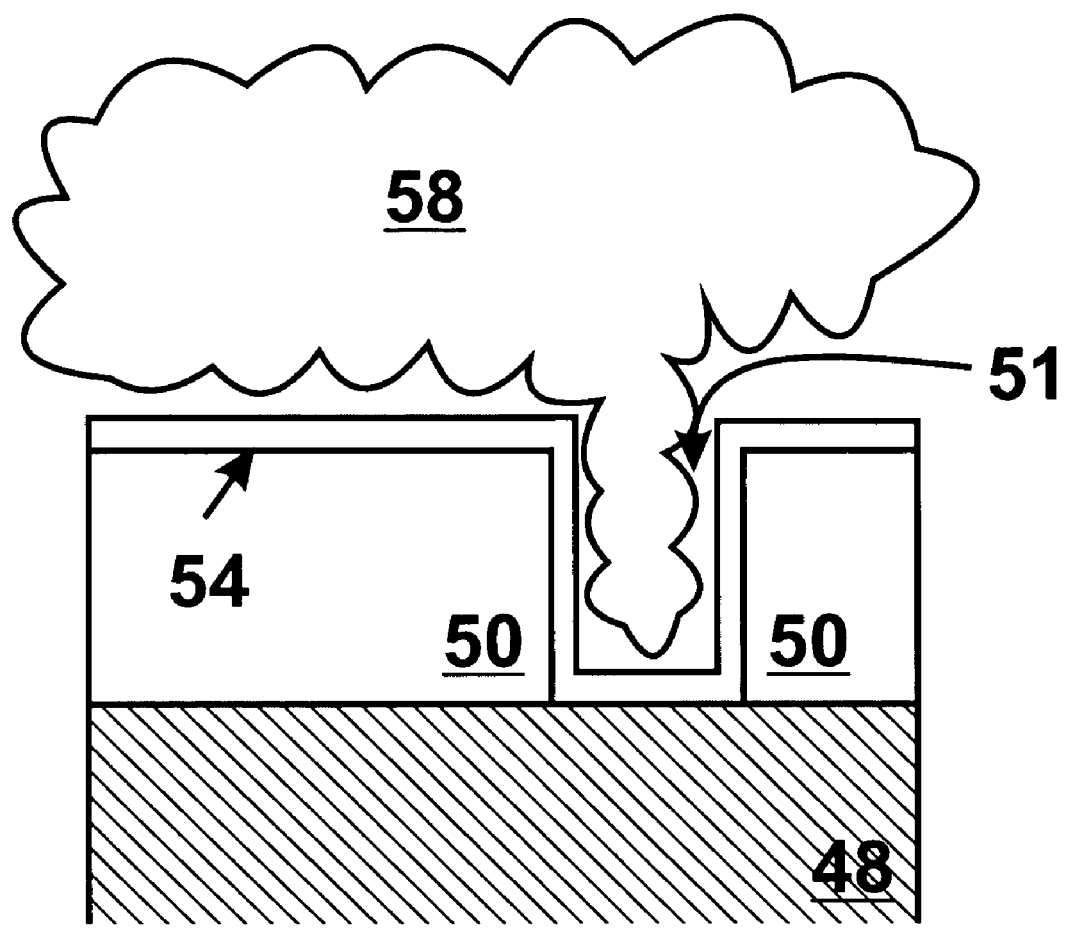

FIG. 5 is a simplified exemplary process flow showing the deposition of low-k and diffusion barrier layers and a plasma treatment process according to an embodiment of the present invention. FIGS. 6A-6C which are exemplary simplified cross-sectional views of a semiconductor substrate showing the deposition of low-k and diffusion barrier layers and a plasma treatment process according to another embodiment of the present invention. Method 38 includes process 40 for depositing a low-k layer on the wafer, process 42 for depositing a barrier layer overlying the low-k layer, and process 44 for applying a plasma treatment process. These diagrams are merely examples, which should not unduly limit the scope of the claims herein. One of ordinary skill in the art would recognize many variations, modifications, and alternatives.

In process 40, a low-k layer 50 is deposited on top of surface region 48, which may comprise one or more layers overlying a semiconductor substrate. For example, surface region 48 may comprise a metallic layer. In another example, dielectric layer 50 may be patterned in a damascene, dual damascene process, or other process to create a trench 51 in low-k layer 50. However, the process could be employed without creating a trench in low-k layer 50. In process 42, a thin diffusion barrier layer 54 is formed overlying low-k layer 50 on the exposed horizontal and vertical surfaces of low-k layer 50 and at the bottom of trench 51. In one example, diffusion barrier layer 54 functions as a diffusion barrier. In another example, diffusion barrier layer 54 can prevent or reduce the diffusion from high conductivity metals such as Cu into dielectric materials such as low-k layer 50. In a specific embodiment, such diffusion can result in a conductive buildup and cause short circuits in the integrated circuit. In another specific embodiment, diffusion barrier layer 54 can be formed from materials included, but not limited to, tantalum nitride (TaN), titanium nitride, (TiN), tungsten nitride (WN).

In process 44, diffusion barrier layer 54 is subjected to a plasma environment 58 to cause an interface region between diffusion barrier layer 54 and the dielectric layer 50 to increase a surface roughness of diffusion barrier layer 54 to facilitate adhesion between diffusion barrier layer 54 and dielectric layer 50 at the interface region. For example, the interface region may comprise a portion of diffusion barrier layer 54, a portion of low-k layer 50, or a combination of portions from both diffusion barrier layer 54 and low-k layer 50. During this process, the plasma contacts the horizontal surface of diffusion barrier layer 54 as well as within trench 51 formed in the low-k dielectric layer 50. The thickness of the diffusion barrier layer 54 is maintained during the subjecting of the partially formed wafer to the plasma environment. For example, a variety of gases can be used in this process, including one or more of $N_2O$, $CO_2$, He, and Ar. In another example, other non-reactive gases could also be employed. In a specific embodiment, the duration of the process can be 2-20 seconds and RF power of 10-800 watts can be applied to create the plasma at a pressure of between 1-10 Torr within the processing environment. The deposition of a cap layer may optionally be implemented within method 38 prior to deposition of low-k layer 50. Following the treatment process, additional processes may comprise filling trench 51 with a metal layer overlying diffusion barrier layer 54 prior to further processing the semiconductor substrate, while maintaining attachment between the low k dielectric layer and the diffusion barrier layer at the interface region. Of course, there can be other variations, modifications, and alternatives.

Figure 7:
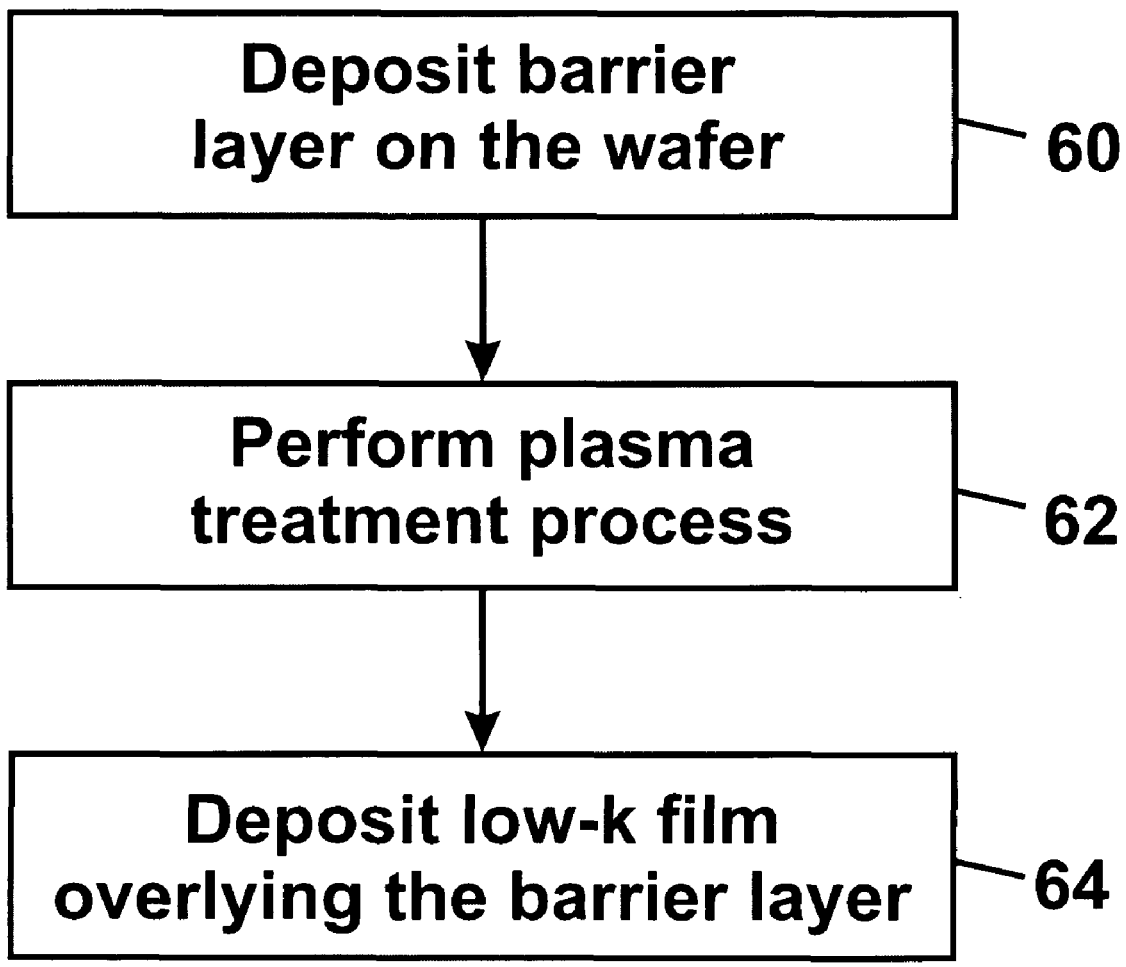
Figure 8A:
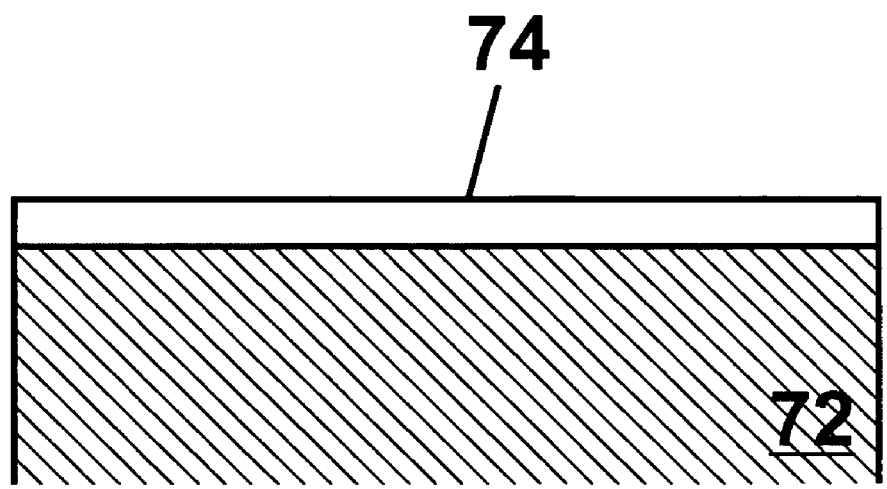
Figure 8B:
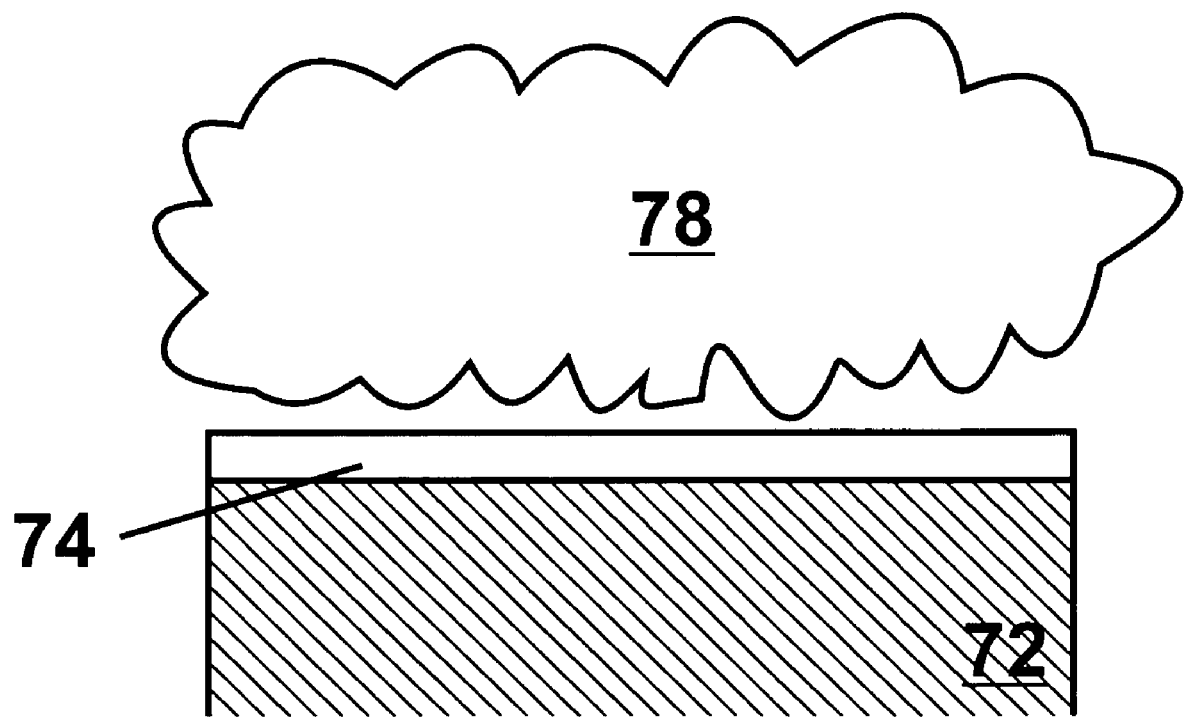
Figure 8C:
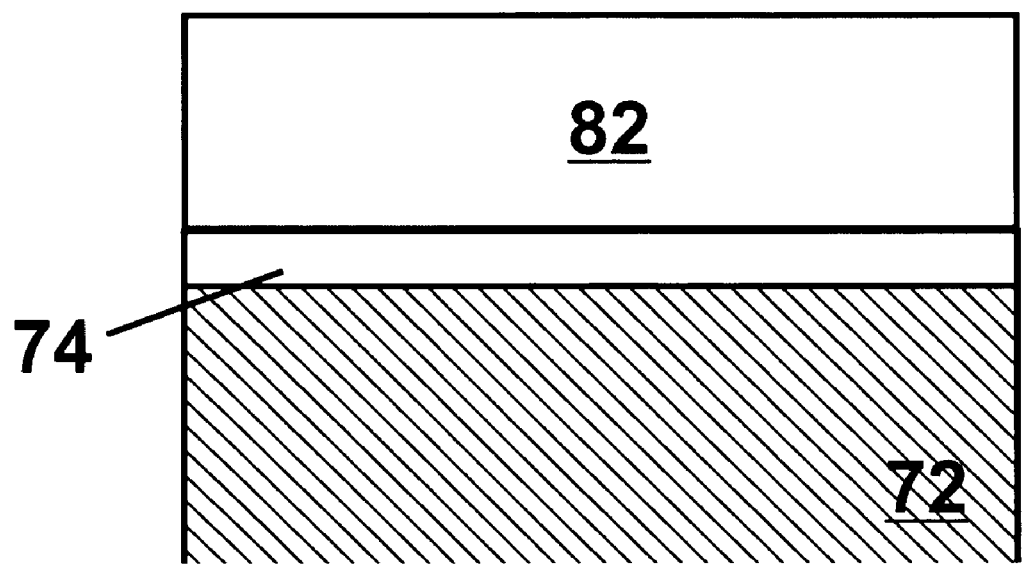

FIG. 7 is a simplified exemplary process flow showing the deposition of low-k and diffusion barrier layers and a plasma treatment process according to yet another embodiment of the present invention. FIGS. 8A-8C are exemplary simplified cross-sectional views of a semiconductor substrate showing the deposition of low-k and diffusion barrier layers and a plasma treatment process according to yet another embodiment of the present invention. Method 66 includes process 60 for depositing a barrier layer on the wafer, process 62 for performing a plasma treatment process, and process 64 for depositing a low-k film overlying the barrier layer. These diagrams are merely examples, which should not unduly limit the scope of the claims herein. One of ordinary skill in the art would recognize many variations, modifications, and alternatives.

In process 60, a diffusion barrier layer 74 is deposited over surface region 72, which may comprise one or more layers overlying a semiconductor substrate. For example, surface region 72 may comprise a metallic layer or other layer whose adjacency to a dielectric layer could cause problems due to diffusion of metallic ions into the dielectric layer. In one example, diffusion barrier layer 74 functions as a diffusion barrier. In another example, diffusion barrier layer 74 can prevent or reduce the diffusion from high conductivity metals such as Cu contained in surface region 72 into dielectric layers. In a specific embodiment, such diffusion can result in a conductive buildup and cause short circuits in the integrated circuit. In another specific embodiment, diffusion barrier layer 74 can be formed from materials included, but not limited to, tantalum nitride (TaN), titanium nitride, (TiN), tungsten nitride (WN). Diffusion barrier layer 74 is then subjected to a plasma environment in process 62 to cause an increase in the surface roughness of at least a portion of diffusion barrier layer 74. For example, this may facilitate an increase in the adhesion strength between the diffusion barrier layer 74 and an adjoining layer deposited in a subsequent process. For example, a variety of gases can be used in this process, including one or more of $N_2O$, $CO_2$, He, and Ar. In another example, other non-reactive gases could also be employed. In a specific embodiment, the duration of process 62 may be 2-20 seconds and RF power of 10-800 watts can be applied to create the plasma at a pressure of between 1-10 Torr within the processing environment. For example, the thickness of the barrier diffusion layer 74 is maintained during the subjecting of the diffusion barrier layer to the plasma environment. Low-k layer 82 is then formed overlying treated diffusion barrier layer 74 in process 64. For example, the adhesion strength between low-k layer 82 and diffusion barrier layer 74 is increased to prevent or reduce delamination between the layers in subsequent processes.

The deposition and plasma treatment processes shown in FIGS. 5 and 7 could be implemented as either in-situ and ex-situ processes. For example, the plasma treatment process could be performed within the same processing environment as the processing environment where the low-k layer or the diffusion barrier layer were deposited, with the plasma treatment immediately following the deposition process. Alternatively, the plasma treatment process could be performed ex-situ within different processing environments as well.

Figure 9A:
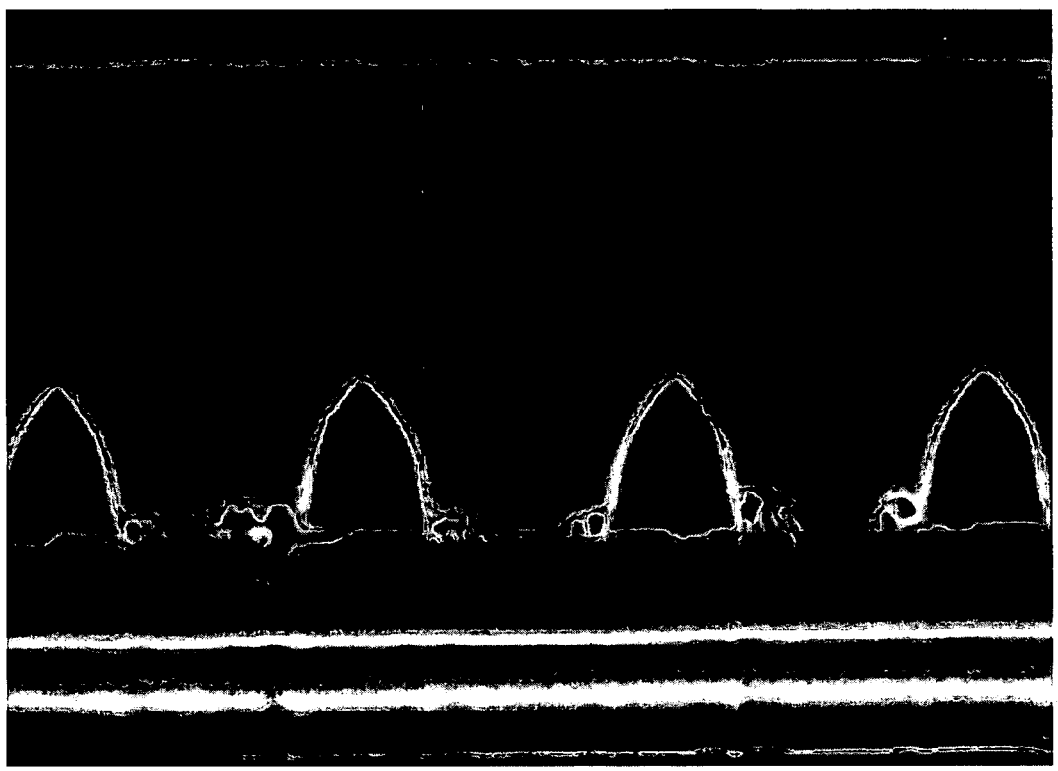
FIGS. 9A and 9B are scanning electron microscope (SEM) images of cross-sections of a semiconductor substrate that do not exhibit delamination according to an embodiment of the present invention.
Figure 9B:
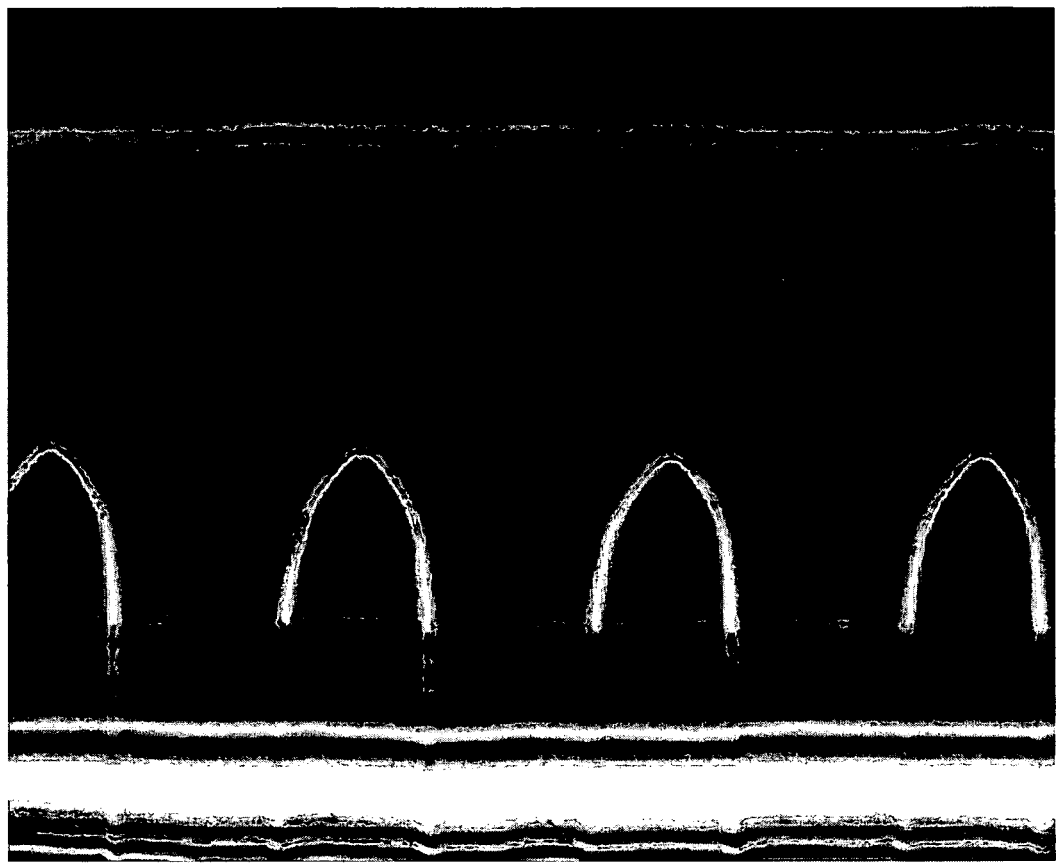

FIGS. 9A and 9B are scanning electron microscope (SEM) images of cross-sections of a semiconductor substrate that do not exhibit delamination according to an embodiment of the present invention. These images are merely examples, which should not unduly limit the scope of the claims herein. One of ordinary skill in the art would recognize many variations, modifications, and alternatives. No delamination between low-k and diffusion barrier layers is visible after the wafer has been treated with a process to increase the adhesion energy between the layers.

While specific embodiments have been discussed in regards to increasing the adhesion strength of low dielectric constant materials, the methods could also be applied to other dielectric layers such as high-k dielectric layers as well.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing a semiconductor device comprising:
   providing a semiconductor substrate with a surface region, the surface region comprising one or more layers overlying the semiconductor substrate;
   forming a dielectric layer overlying the surface region;
   forming a diffusion barrier layer overlying the dielectric layer;
   subjecting only the diffusion barrier layer to a plasma environment to facilitate adhesion between the diffusion barrier layer and the dielectric layer at an interface region; and
   processing the semiconductor substrate while maintaining attachment between the dielectric layer and the diffusion barrier layer at the interface region;
   wherein the subjecting the diffusion barrier layer to a plasma environment includes maintaining a thickness of the barrier diffusion layer,
   wherein the plasma environment is provided at least by N2O, CO2, He, or Ar, or a combination thereof,
   wherein the attachment between the dielectric layer and the diffusion barrier layer at the interface region has an amount of adhesion energy of about 6 J/m$^2$.

2. The method of claim 1 wherein the subjecting the diffusion barrier layer to a plasma environment is performed for a duration between 2-20 seconds.

3. The method of claim 1 wherein the subjecting the diffusion barrier layer to a plasma environment is performed at a pressure of 1-10 Torr.

4. The method of claim 1 wherein the subjecting the diffusion barrier layer to a plasma environment is performed with an RF power between 10-200 W.

5. The method of claim 1 wherein the processing the semiconductor substrate while maintaining attachment between the dielectric layer and the diffusion barrier layer at the interface region is a chemical-mechanical polishing process.

6. The method of claim 1 wherein the dielectric layer is a low-k layer.

7. The method of claim 1 wherein the forming a diffusion barrier layer overlying the dielectric layer and the subjecting the diffusion barrier layer to a plasma environment are performed in-situ.

8. The method of claim 1 further comprising forming a trench in the dielectric layer, wherein the diffusion barrier layer additionally overlies the sidewalls and bottom of the trench.

9. The method of claim 8 wherein the trench is formed by a dual damascene process.

10. The method of claim 8 further comprising forming a metal layer in the trench overlying the diffusion barrier layer prior to processing the semiconductor substrate, while maintaining attachment between the low k dielectric layer and the diffusion barrier layer at the interface region.

11. The method of claim 1 wherein the subjecting the diffusion barrier layer to a plasma environment increases a surface roughness of the interface region between the diffusion barrier layer and the dielectric layer.

12. A method of manufacturing a semiconductor device comprising:
    providing a semiconductor substrate with a surface region, the surface region comprising one or more layers overlying the semiconductor substrate;
    forming a dielectric layer overlying the surface region;
    forming a diffusion barrier layer overlying the dielectric layer;
    subjecting only the diffusion barrier layer to a plasma environment for a duration ranging from 2 seconds to 20 seconds at a pressure ranging from 1 Torr to 10 Torr with an RF power ranging from 10 W to 200 W to facilitate adhesion between the diffusion barrier layer and the dielectric layer at an interface region, the plasma environment being provided at least by N2O, CO2, He, or Ar, or a combination thereof; and
    processing the semiconductor substrate while maintaining attachment between the dielectric layer and the diffusion barrier layer at an interface region;
    wherein the subjecting the diffusion barrier layer to a plasma environment includes maintaining a thickness of the barrier diffusion layer,
    wherein the adhesion between the diffusion barrier layer and the dielectric layer at an interface region has an amount of adhesion energy of about 6 J/m$^2$.

13. The method of claim 12 wherein the subjecting the diffusion barrier layer to a plasma environment facilitates adhesion between the diffusion barrier layer and the dielectric layer at an interface region.

14. A method of manufacturing a semiconductor device comprising:

provoiding a semiconductor substrate with a surface region, the surface region comprising one or more layers overlying the semiconductor substrate;

forming a dielectric layer overlying the surface region;

forming a diffusion barrier layer overlying the dielectric layer;

subjecting the diffusion barrier layer to a plasma environment to facilitate adhesion between the diffusion barrier layer and the dielectric layer at an interface region;

processing the semiconductor substrate while maintaining attachment between the dielectric layer and the diffusion barrier layer at the interface region;

wherein the subjecting the diffusion barrier layer to a plasma environment includes maintaining a thickness of the barrier diffusion layer, and wherein the attachment between the dielectric layer and the diffusion barrier layer at the interface region has an amount of adhesion energy of about 6 $J/m^2$.

15. The method of claim 14 wherein the diffusion barrier layer is formed from materials including tantalum nitride (TaN), titanium nitride, (TiN), or tungsten nitride (WN).

16. The method of claim 14 wherein the subjecting the diffusion barrier layer to a plasma environment increases a surface roughness of the interface region between the diffusion barrier layer and the dielectric layer.

17. The method of claim 14 wherein the forming a diffusion barrier layer overlying the dielectric layer and the subjecting the diffusion barrier layer to a plasma environment are performed in-situ.

* * * * *